United States Patent
McDavitt

(10) Patent No.: US 9,581,311 B2
(45) Date of Patent: *Feb. 28, 2017

(54) BACKLIGHT DISPLAY USING PHOTOLUMINESCENT MATERIAL TUNED TO IMPROVE NVIS COMPATIBILITY

(71) Applicant: L-3 COMMUNICATIONS CORPORATION, New York, NY (US)

(72) Inventor: Daniel L. McDavitt, Roswell, GA (US)

(73) Assignee: L-3 COMMUNICATIONS CORPORATION, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/748,793

(22) Filed: Jun. 24, 2015

(65) Prior Publication Data

US 2016/0003449 A1  Jan. 7, 2016

Related U.S. Application Data

(63) Continuation-in-part of application No. 13/789,474, filed on Mar. 7, 2013, now Pat. No. 9,068,717.

(Continued)

(51) Int. Cl.
*F21V 9/16* (2006.01)
*G02F 1/1335* (2006.01)
(Continued)

(52) U.S. Cl.
CPC .......... *F21V 9/16* (2013.01); *G02F 1/133603* (2013.01); *G02F 1/133617* (2013.01);
(Continued)

(58) Field of Classification Search
CPC ........ F21V 9/10; F21V 9/16; G02F 1/133603; G02F 2202/36; A01B 12/006
(Continued)

(56) References Cited

U.S. PATENT DOCUMENTS 1,348,957 A  8/1920  Pope
3,143,300 A  8/1964  Way
(Continued)

FOREIGN PATENT DOCUMENTS

EP  E0438817  7/1991
EP  1909134 A2  4/2008
(Continued)

OTHER PUBLICATIONS

European Search Report and Written Opinion on Patentability; Dated Jul. 24, 2013; for EP Application No. 13158666.1.
(Continued)

*Primary Examiner* — Ali Alavi
(74) *Attorney, Agent, or Firm* — Gardner Groff Greenwald & Villanueva, PC

(57) ABSTRACT

An NVIS-compatible backlight assembly for an LCD display comprising a short-wavelength (blue) light source positioned in a first layer and a photoluminescent layer positioned adjacent the first layer for transforming blue monochrome emission from the blue light source into tricolor light for use as a full-color light source, while minimizing radiance in NVIS-sensitive regions.

20 Claims, 8 Drawing Sheets

Related U.S. Application Data

(60) Provisional application No. 61/609,718, filed on Mar. 12, 2012.

(51) Int. Cl.
*G02F 1/017* (2006.01)
*H01L 33/50* (2010.01)

(52) U.S. Cl.
CPC .............. *G02F 2001/01791* (2013.01); *G02F 2001/133614* (2013.01); *G02F 2001/133624* (2013.01); *G02F 2202/36* (2013.01); *H01L 33/507* (2013.01)

(58) Field of Classification Search
USPC .................................................. 362/84, 231
See application file for complete search history.

(56) References Cited

U.S. PATENT DOCUMENTS

| | | | |
|---|---|---|---|
| 3,805,049 A | 4/1974 | Frank et al. | |
| 3,816,739 A | 6/1974 | Stolov | |
| 4,380,791 A | 4/1983 | Nishizawa | |
| 4,436,379 A | 3/1984 | Funada et al. | |
| 4,490,777 A | 12/1984 | Tanner et al. | |
| 4,535,394 A | 8/1985 | Dugre | |
| 4,610,507 A | 9/1986 | Kamamori et al. | |
| 4,641,446 A | 2/1987 | Jackson | |
| 5,221,978 A | 6/1993 | Heynderickx et al. | |
| 5,315,420 A | 5/1994 | Narutaki et al. | |
| 5,452,113 A | 9/1995 | Ikeno | |
| 5,726,723 A | 3/1998 | Wang et al. | |
| 5,764,316 A | 6/1998 | Takizawa et al. | |
| 5,813,753 A * | 9/1998 | Vriens | H01L 33/502 257/13 |
| 5,876,107 A | 3/1999 | Parker et al. | |
| 5,952,992 A | 9/1999 | Helms | |
| 5,998,925 A * | 12/1999 | Shimizu | C09K 11/7767 257/103 |
| 6,028,656 A | 2/2000 | Buhrer et al. | |
| 6,129,444 A | 10/2000 | Tognoni | |
| 6,646,696 B1 | 11/2003 | Walsh | |
| 6,809,781 B2 * | 10/2004 | Setlur | C09K 11/0844 252/301.4 F |
| 6,975,376 B2 | 12/2005 | Kim | |
| 2004/0001344 A1 * | 1/2004 | Hecht | F21V 29/76 362/555 |
| 2004/0005990 A1 * | 1/2004 | Aubay | C11D 3/06 510/218 |
| 2006/0170838 A1 | 8/2006 | Choi et al. | |
| 2010/0188613 A1 | 7/2010 | Tsukahara et al. | |

FOREIGN PATENT DOCUMENTS

| | | |
|---|---|---|
| JP | 56-70524 | 3/1985 |
| WO | 95/12964 A1 | 5/1995 |
| WO | 2012/021643 A2 | 2/2012 |

OTHER PUBLICATIONS

Fenbing Wu et al: "Developing Quantum Dot Phosphor-Based Light-Emitting Diodes for Aviation Lighting Applications", Journal of Nanomaterials, vol. 22, No. 2, Jan. 4, 2012.
3M Dual Brightness Enhancement Film—The film that gives light a second chance; 6 pages; St. Paul, MN (USA).

* cited by examiner

BACKLIGHT DISPLAY USING PHOTOLUMINESCENT MATERIAL TUNED TO IMPROVE NVIS COMPATIBILITY

CROSS-REFERENCE TO RELATED APPLICATIONS

This application is a continuation-in-part of U.S. Non-Provisional patent application Ser. No. 13/789,474, filed on Mar. 7, 2013, which claims the priority benefit of U.S. Provisional Patent Application Ser. No. 61/609,718, filed on Mar. 12, 2012.

BACKGROUND

Night Vision Imaging System (NVIS) applications often require displays to be compatible with Night Vision goggles. Long Visible and Near-infrared wavelength emissions cause displays to "bloom" or have a "halo effect", which interferes with the user's goggles and also represents an undesirable beacon to other goggle users. Goggle interference is caused by the bright source/blooming object overloading the intensifier tube, which resultantly whites out adjacent features in the field of view or causes a loss of the entire image. Thus, radiance within NVIS-sensitive regions should be minimized or avoided, as shown in FIG. 1.

LCD display configurations typically include LED or fluorescent backlights. These backlights have the unwanted characteristic of emitting radiance in the NVIS region of the spectrum. This radiance causes blooming in the display which then must be minimized in NVIS applications.

NVIS compatibility is usually achieved using costly dichroic/thin-film and/or glass absorption based NVIS filters. The dichroic filter's spectral profile is controlled by vacuum deposition layered coatings to produce selective interference, such as a quarter wave stack. A glass absorption filter's spectrum is created by the absorption properties of the inorganic and/or organic compounds built into the glass substrate. Dichroic NVIS filtering schemes have spectrums that are dependent on incident angle transmission.

Moreover, both absorptive and dichroic NVIS filters often reduce a display's color gamut in the attempt to reduce NVIS radiance.

Accordingly, a need exists for an improved flat-panel display backlight which lowers the costs associated with typical NVIS solutions and avoids the emission of unwanted energies, while maintaining acceptable chromaticities. It is to the provision of solutions to this and other problems that the present invention is primarily directed.

SUMMARY

In a first preferred example form, the present invention comprises an NVIS-compatible backlight assembly for an LCD display that includes a blue light source positioned in or at a first layer and a photoluminescent layer positioned generally adjacent the first layer. The photoluminescent material converts short-wavelength blue emissions into a set three primary color sources for use as a full-color light source while minimizing emissions in NVIS sensitive regions. In one example form, the NVIS-compatible backlight is adapted for selectively minimizing undesired emissions.

Optionally, the short-wavelength light source comprises an array of blue LED elements positioned in the first layer. In another optional form, the photoluminescent layer comprises quantum dots.

Preferably, the long-wavelength emission peak from the photoluminescent layer is selected to minimize NVIS-sensitive emissions while allowing for an output that produces desirable full-color display color saturation.

Additionally, the photoluminescent backlight assembly can provide narrow emission profiles to create distinct, more saturated colors. The photoluminescent backlight assembly can also allow the peak locations to be optimized to match an LCD's color filter peaks allowing for efficiency gains. Also optionally, scattering elements can be included to avoid the need for diffusion layers.

Optionally, the photoluminescent backlight may be used to further enhance a standard NVIS-compatible display's NVIS performance or be used to meet additional full-color and monochrome NVIS requirements.

Optionally, the tri-color light profiles outputted by the photoluminescent layer for use as a full-color light source each has a Gaussian energy output distribution, and the long-wavelength emission peak is selected to minimize emissions in the NVIS sensitive regions.

Preferably, the tri-color light outputted by the photoluminescent layer for use as a full-color light source each has a Gaussian energy output distribution, and the long-wavelength emission peak is selected to minimize emissions in the NVIS sensitive regions. In addition or in the alternative, the medium-wavelength emission peak can be selected to minimize emission in NVIS sensitive regions.

Advantageously, this approach eliminates the need for expensive NVIS filtering, while at the same time providing full-color NVIS compatibility and NVIS compliance. Also, this approach allows for the use of cheaper monochromatic blue LEDs as a base light source, while still providing full-color NVIS compatibility and compliance.

Advantageously, this approach can provide more distinct and saturated colors while using less power. The power efficiency is achieved, at least in part, by avoiding the creation of emissions that have to be subsequently filtered.

BRIEF DESCRIPTION OF THE DRAWING FIGURES AND TABLES

FIG. 1 is a schematic graph of the spectral profile response of typical prior art Class-B goggles, depicting the NVIS "sensitive region".

FIG. 2 A is a schematic functional depiction of an NVIS-compatible display according to a first preferred form of the present invention and showing the light output of the components thereof, and FIGS. 2B, 2C and 2D illustrate alternative arrangements of an NVIS-compatible display according to other forms of the present invention.

TABLE 1 lists the NVIS radiance requirements and the performance of a prototype of the present invention.

Figure 5:
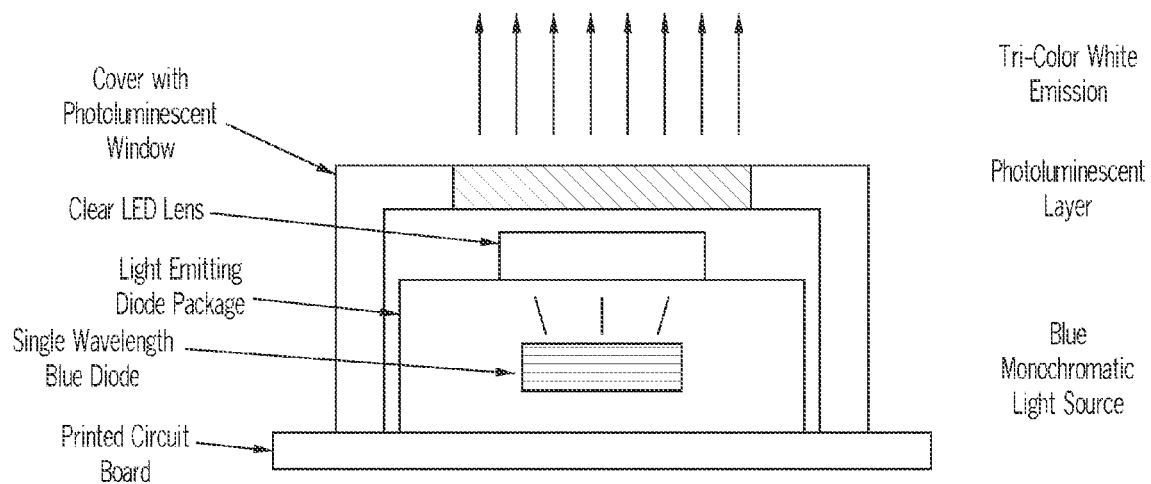

FIG. 5 is a schematic functional depiction of an NVIS-compatible display according to a first alternate form of the present invention.

Figure 6:
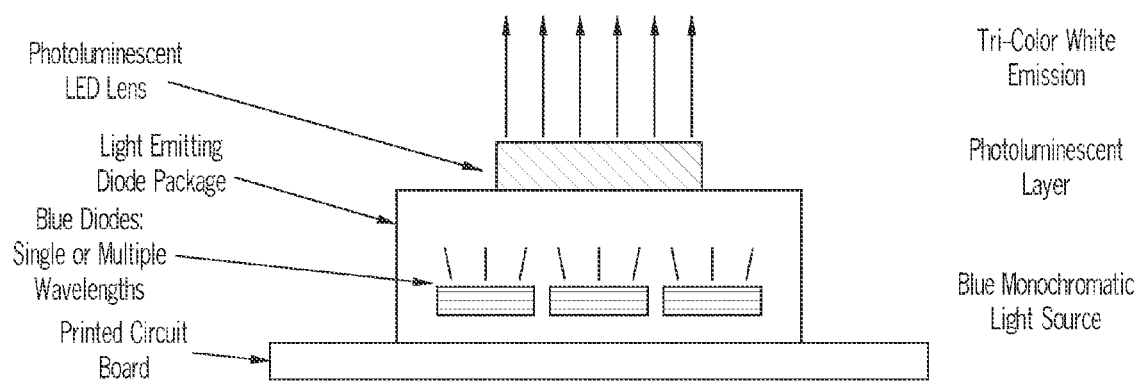

FIG. 6 is a schematic functional depiction of an NVIS-compatible display according to a second alternate form of the present invention.

Figure 7:
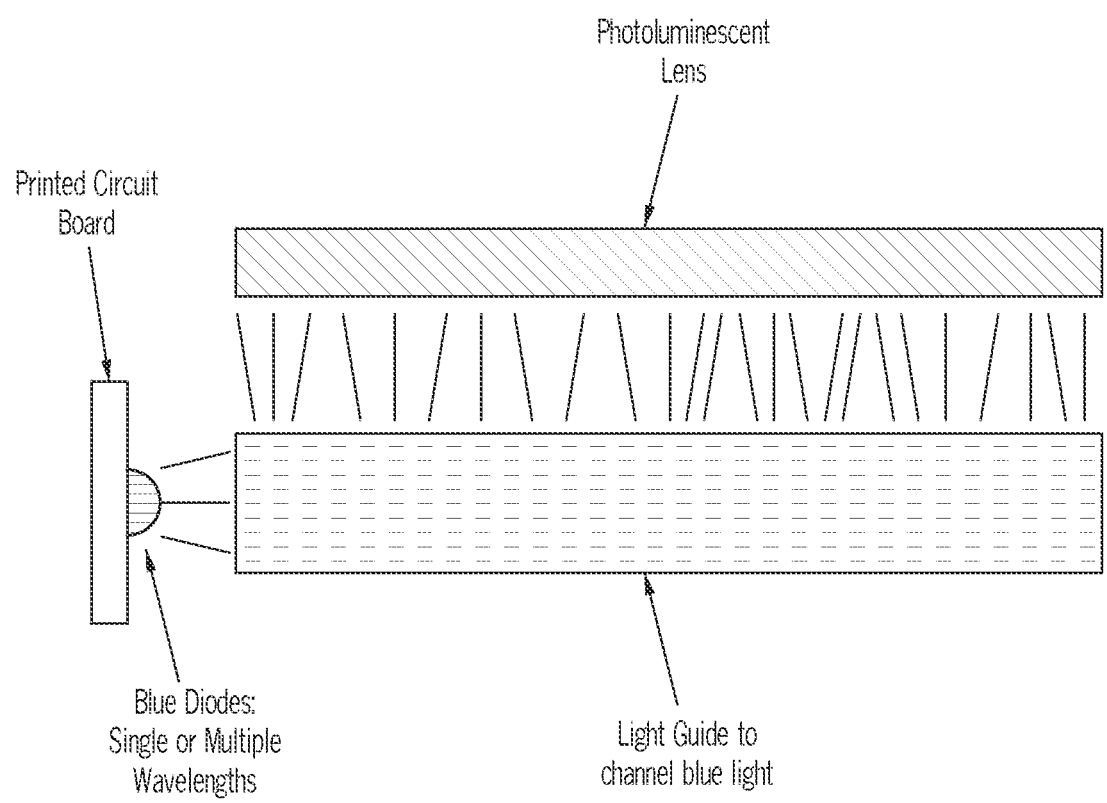

FIG. 7 is a schematic functional depiction of an NVIS-compatible display according to a third alternate form of the present invention.

DESCRIPTION OF EXAMPLE EMBODIMENTS

It is to be understood that this invention is not limited to the specific devices, methods, conditions, or parameters described and/or shown herein, and that the terminology used herein is for the purpose of describing particular embodiments by way of example only. Thus, the terminology is intended to be broadly construed and is not intended to be limiting of the claimed invention. For example, as used in the specification including the appended claims, the singular forms "a," "an," and "one" include the plural, the term "or" means "and/or," and reference to a particular numerical value includes at least that particular value, unless the context clearly dictates otherwise. In addition, any methods described herein are not intended to be limited to the sequence of steps described but can be carried out in other sequences, unless expressly stated otherwise herein. As used herein, the term "blue monochromatic light source" is defined as a source predominantly emitting light in one or more wavelengths in the visible blue light spectrum, generally accepted to be the region between 400 and 495 nanometers.

Figure 1:
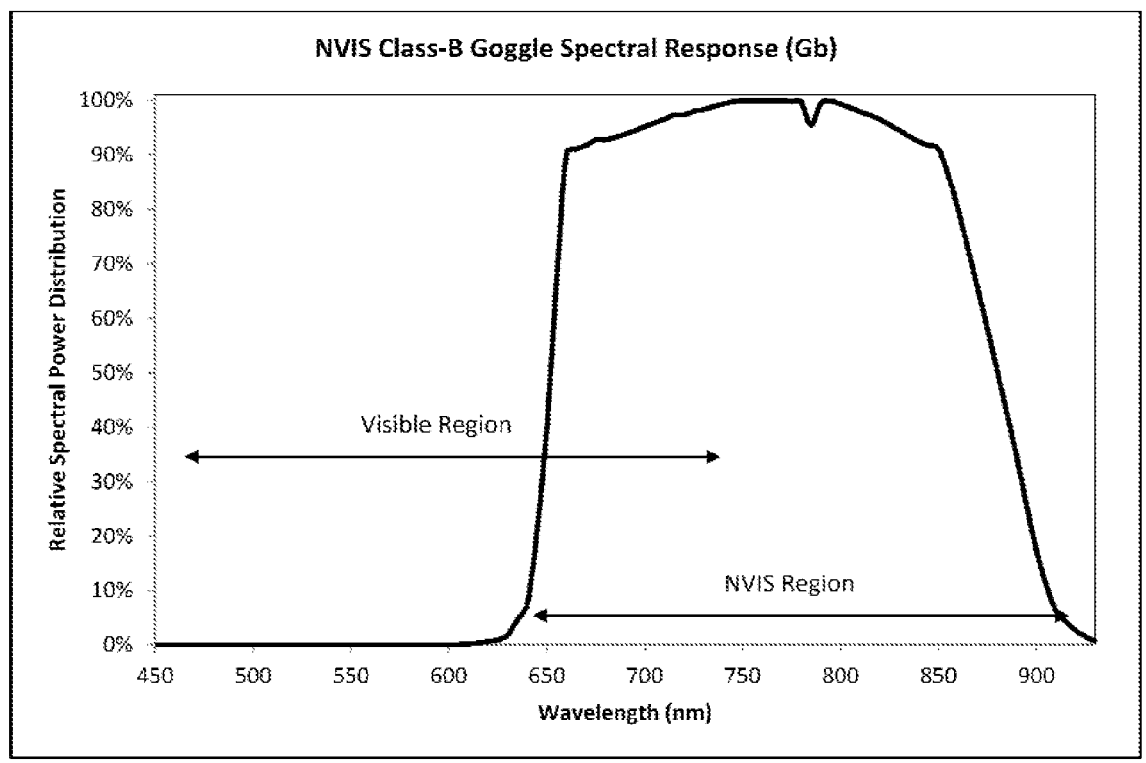
Figure 2A:
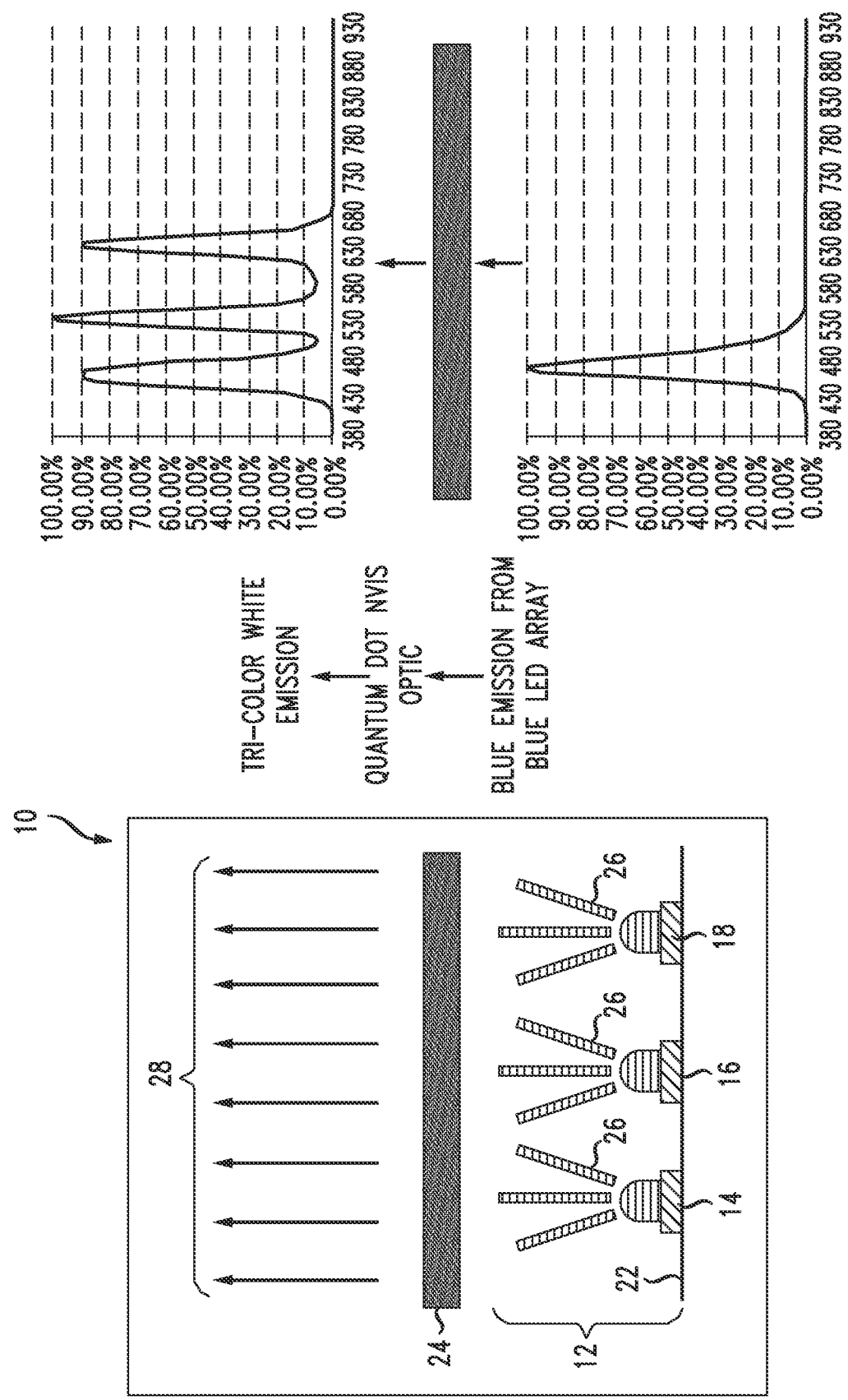

As shown in FIG. 2A, the present invention comprises a backlight 10 for an LCD display and includes a blue LED light source, in this example an array 12 of blue LED elements (14, 16, 18) positioned in a first layer 22. A photoluminescent layer 24 is positioned generally adjacent the first layer 22 of blue LED elements for converting blue LED emissions 26 into tri-colored light 28 for use as a full-color light source, the photoluminescent layer 24 being adapted for minimizing emissions in the NVIS sensitive range. Optionally, the array of blue led elements can comprise multiple LEDs emitting at the same wavelength or multiple LEDs emitting at different wavelengths in the 400 to 495 nm range.

Optionally, the tri-color light profiles 28 outputted by the photoluminescent layer 24 for use as a full-color light source each has a Gaussian energy output distribution, and the long-wavelength emission peak is selected to minimize emissions in the NVIS sensitive regions. In addition or in the alternative, the medium-wavelength emission peak can be selected to minimize emission in NVIS sensitive regions.

Figure 3:
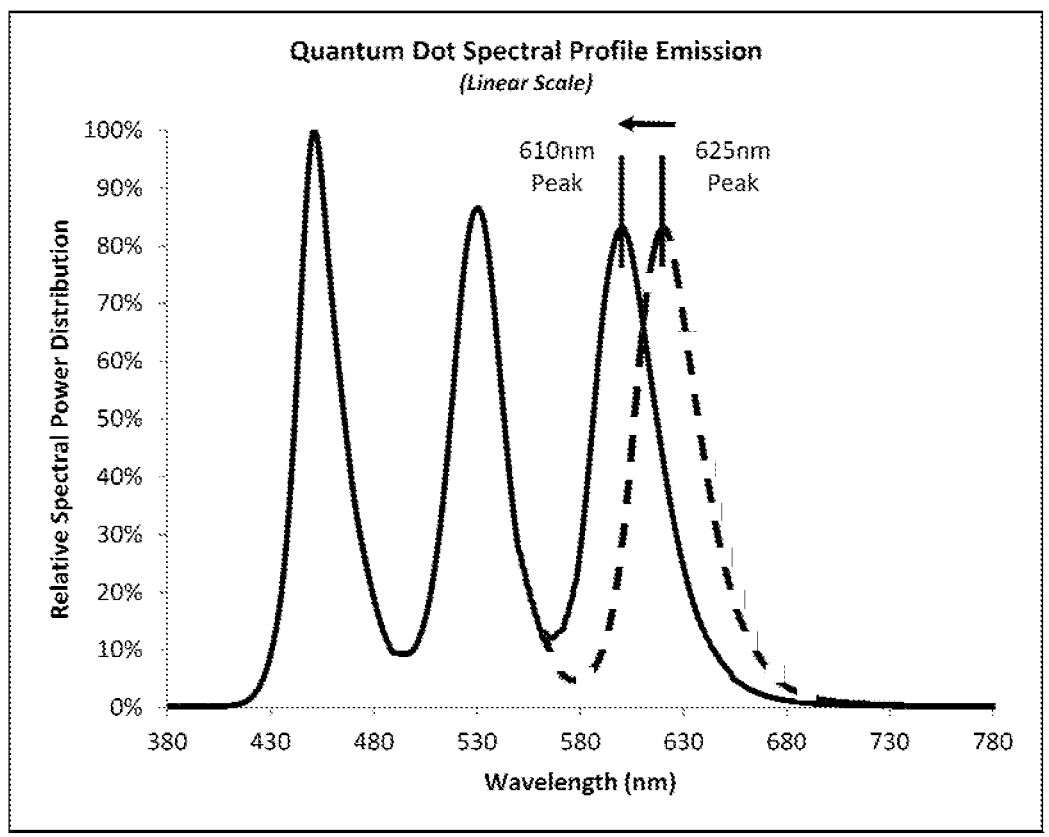
FIG. 3 is a schematic diagram of the performance of the NVIS-compatible display of FIG. 2A, depicting a shifted long-wavelength peak of a photoluminescent NVIS-compatible spectral profile.
Figure 4:
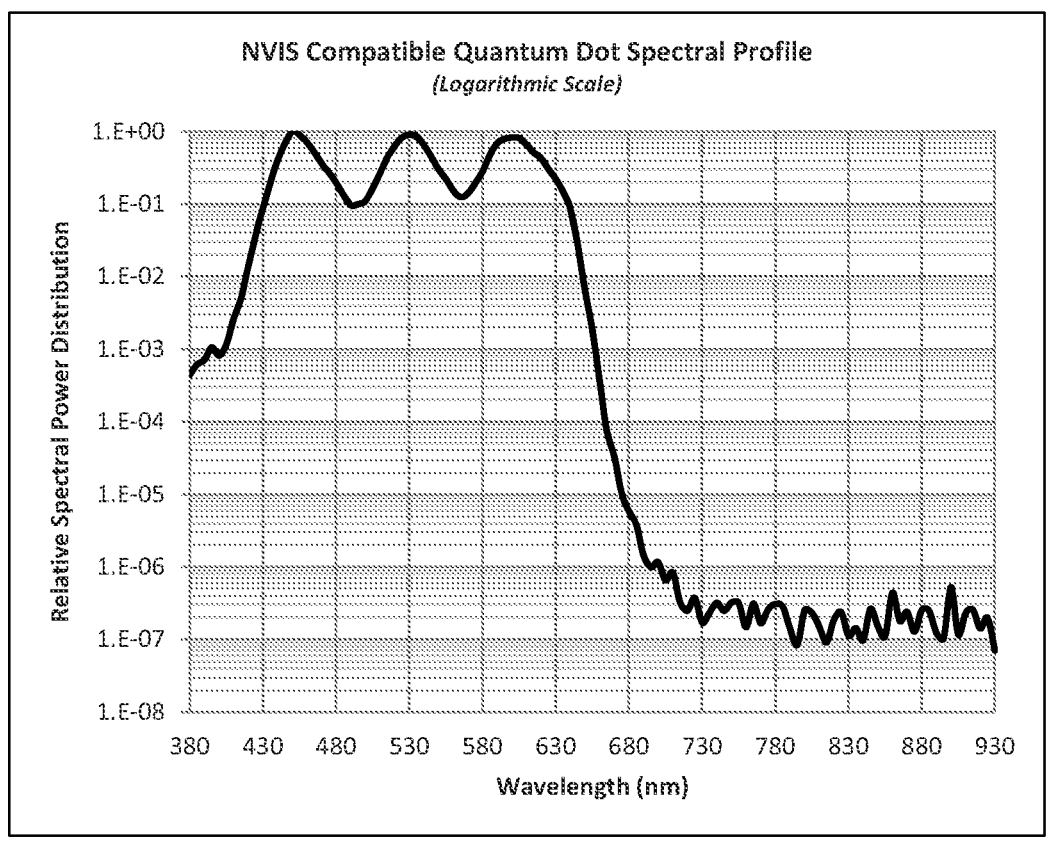
FIG. 4 is a schematic diagram of the spectral response of the NVIS-compatible display of FIG. 2A.

The photoluminescent material works with a blue backlight which excites the photoluminescent-layer, causing medium and long-wavelength emissions, creating a "tunable" white source, as illustrated in FIG. 2A. In this regard, "tunable" does not refer to an ability to tune the device like a radio dial after it is constructed, but rather to the ability to design the device to have a desired performance. Thus, the "tuning" is accomplished in the design phase, not during use. One approach to tuning the long-wavelength peak is illustrated in FIG. 3.

Preferably, the three primary color sources comprise a short-wavelength (450 nm center, ≤30 nm FWHM) emission profile equivalent to pinkish-blue, a medium-wavelength (540 nm center, ≤30 nm FWHM) profile equivalent to yellowish-green and a long-wavelength (610 nm center, ≤20 nm FWHM) emission profile equivalent to reddish-orange (color definitions per Gage, et al., "Optoelectonics Application Manual" 1st edition, McGraw Hill, N.Y., 1977).

Such a photo-luminescent backlight offers several advantages. First, blue LEDs are both cheaper and more efficient than white and RGB LED sources. Second, the peak outputs from the tri-color photoluminescent backlight can be tuned to match the LCD's color filters, providing greater efficiency. Third, the narrow profiles of the emission peaks create display colors that are more distinct and more saturated. In the past such technologies have not been used for NVIS-sensitive environments/applications, because prior art photoluminescent backlights output unwanted emissions in NVIS sensitive regions. The present invention avoids such problems by avoiding the creation of unwanted emissions in the NVIS wavelength range, thereby also avoiding the need for supplemental filters to remove those unwanted emissions.

Advantageously, the present approach uses light, not voltage, to excite the photoluminescent material 14, 16, 18. In this regard, the material is operated in a passive mode or manner.

Advantageously, this approach eliminates the need for expensive NVIS filtering, while at the same time minimizing emissions in the NVIS sensitive region (which can interfere with NVIS goggles). Also, this approach allows for the use of cheaper monochromatic (e.g., blue) LEDs as a base light source, while still providing full-color NVIS compatibility and compliance. Also, this approach can be used to tune the emission peaks from the photoluminescent layer to match certain color filters in an LCD display to improve color saturation. For example, this can produce display colors that are more intense and/or more distinct from other colors.

Optionally, the blue LED light source could be replaced with another blue light source. For example, one can use fluorescent light sources, including hot cathode fluorescent lamps (HCFL) and cold cathode fluorescent lamps (CCFL). Also, one can use Light-Emitting Diodes, including semiconductor light-emitting diodes (LEDs), organic light-emitting diodes (OLED), and polymer light-emitting diodes (PLED). Also, one can employ lasers, including laser diodes, or electroluminescent Quantum Dot Light-emitting Devices (QD-LEDs or QLEDs). Moreover, other prior art light source technologies can be used, such as electron stimulated (CRT, etc.), incandescent (conventional tungsten, halogen, etc.), high-intensity discharge (xenon arc, etc.), and others which could be adapted for this application to generate a higher or equivalent energy/lower wavelength output sufficient to create the desired emissions in the photoluminescent layer.

Advantageously, this approach can provide cheaper and better color (the colors can be more distinct with better saturation), while using less power. The power efficiency can be achieved, at least in part, due to avoiding creating energies that have to be subsequently filtered.

Figure 2B:
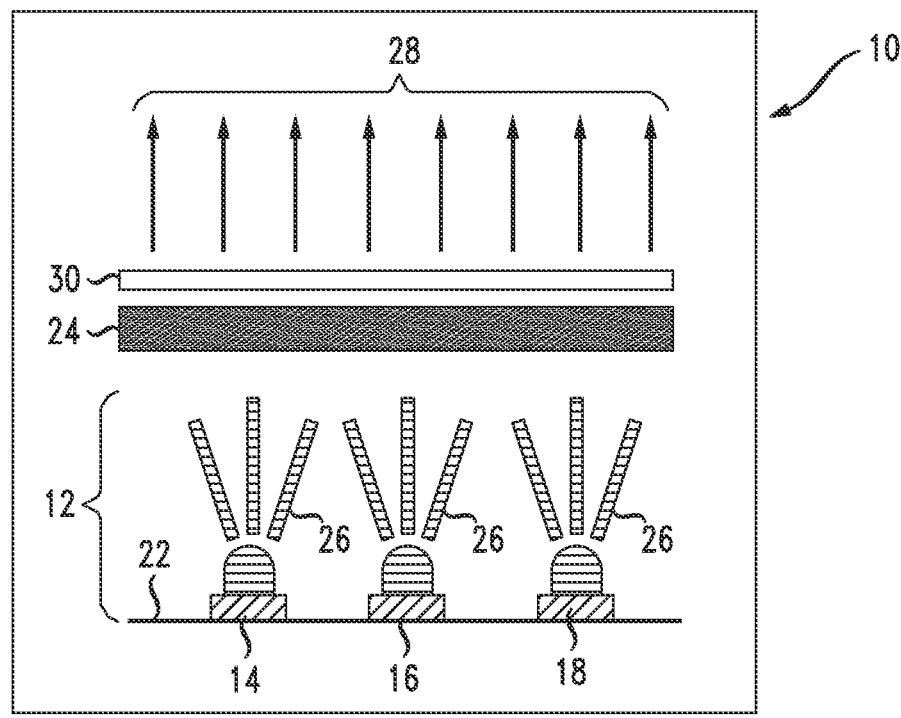
Figure 2C:
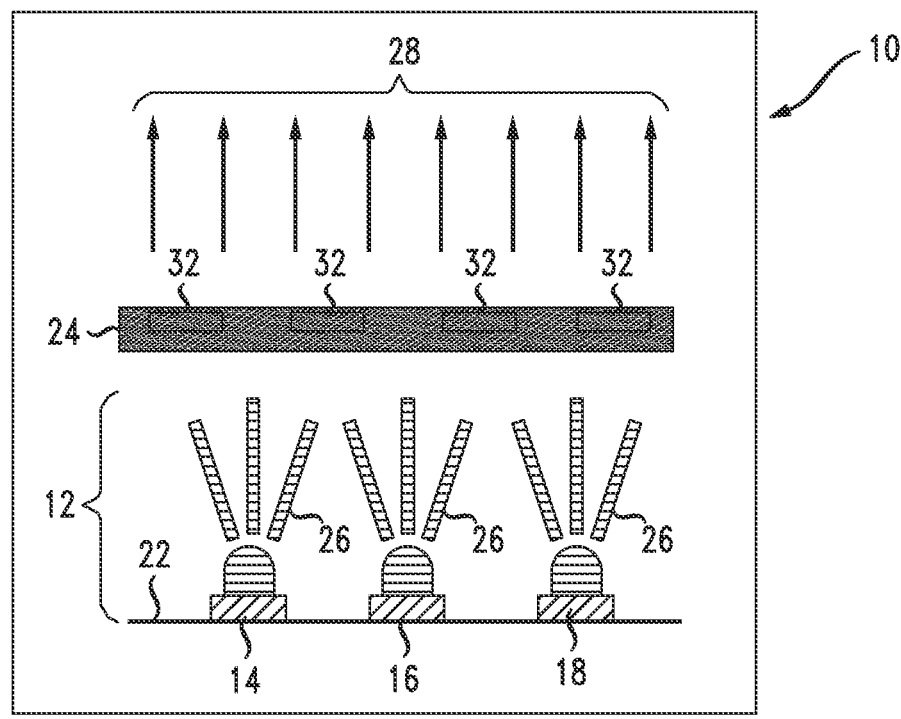
Figure 2D:
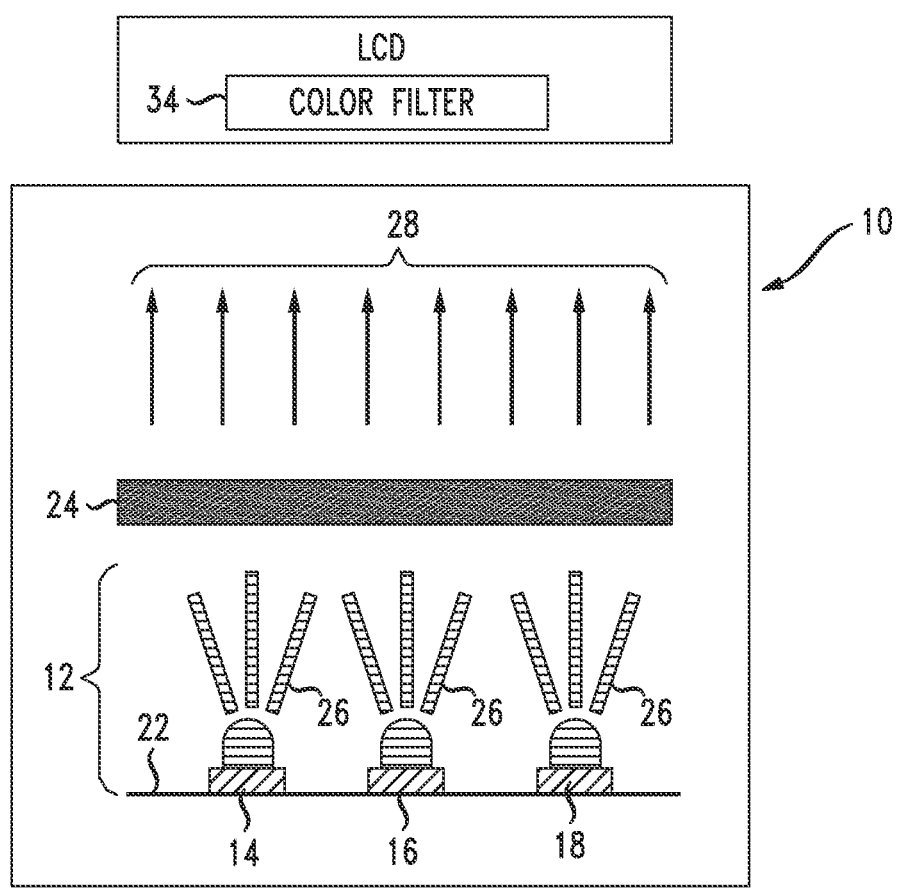

Advantageously, an NVIS-compatible backlight assembly according to the present invention allows an array of relatively inexpensive blue LEDs, together with a photoluminescent layer positioned adjacent the array of blue LEDs, to minimize radiance in NVIS-sensitive spectral regions. The emitted tri-color light output from the photoluminescent layer can have Gaussian emission profiles with the long-wavelength emission peak tuned to minimize spectral emissions in the NVIS sensitive regions, enhancing NVIS compatibility. Also, advantageously, the spectral profile emitted by the photoluminescent layer is substantially independent of angle of incidence. Furthermore, the backlight assembly is NVIS-compatible without needing any thin-film/dichroic-based NVIS filters. Optionally, one can augment the arrangement with supplemental NVIS radiance filtering 30, as shown in FIG. 2B. Also, one can augment the arrangement with scattering elements 32, as shown in FIG. 2C, to minimize any need for a diffusion layer. Further, the peak outputs from the photoluminescent layer can be tuned to match the LCD's color filters 34, providing greater efficiency, as shown in FIG. 2D. In addition, the photoluminescent layer can be supplemented with standard NVIS filtering schemes to further improve NVIS performance and pass stricter NVIS requirement levels. Optionally, the photoluminescent layer can be configured to operate as a filter, lens or other optical component.

The inventions disclosed herein have several advantages over NVIS filtering schemes:
1. Greater power efficiency is achieved by using more efficacious blue LEDs and by avoiding the creation of energies that are subsequently filtered.
2. The ability of the photoluminescent layer to tune the location of the emission peaks that match an LCD's color filters.
3. The emission from the photoluminescent layer exhibits narrow profiles which result in improved colors that are more distinct and have greater saturation.
4. The narrow Gaussian profile and tuning of the long-wavelength emission peak allows the display configuration to achieve NVIS compatibility and compliance while maintaining greater color gamut.
5. The photoluminescent layer's spectral profile remains fixed over a wide angle of incidence.

This approach also eliminates the need for expensive dichroic/thin-film and absorptive NVIS filters, while at the same time making use of cheaper monochromatic blue LEDs.

A prototype display utilizing the above approach shows promising results. A blue LED backlight was mated with a photoluminescent layer deposited on a polyester gel film as part of the backlight configuration for an LCD display. The display exhibits no blooming when observed through NVIS goggles and passes MIL-STD-3009 Class-B spectral radiance performance requirements for multi-color displays, as listed in Table 1.

TABLE 1

NVIS Class-B Requirements and Performance of a Proposed Prototype Backlight Solution

| Color Fields | NVIS-compatible phtoluminescent backlight performance | NVIS-B Type I/II Requirement |
|---|---|---|
| White | 2.1E−09 | 2.2E−09 |
| Max | 1.0E−08 | 1.1E−08 |

The arrangement of the blue light source layer and the adjacent photoluminescent layer can be constructed in various configurations. FIGS. 5-7 show three possible configurations (in addition to the configuration shown in FIG. 2). [FIG. 5 is a schematic functional depiction of an NVIS-compatible display according to a first alternate form of the present invention. FIG. 6 is a schematic functional depiction of an NVIS-compatible display according to a second alternate form of the present invention. FIG. 7 is a schematic functional depiction of an NVIS-compatible display according to a third alternate form of the present invention.

While the invention has been shown and described in exemplary forms, it will be apparent to those skilled in the art that many modifications, additions, and deletions can be made therein without departing from the spirit and scope of the invention as defined by the following claims. For example:

a. The photoluminescent layer may be supplemented with standard NVIS filtering schemes to further improve NVIS performance and achieve stricter NVIS requirement levels.
b. The photoluminescent layer approach may be applied to monochrome displays and additional NVIS-Class standards and requirements.
c. The photoluminescent layer may be configured to operate as a filter, lens or other optical component.
d. The photoluminescent layer may include scattering elements to avoid or lessen the need for a diffusion layer.

These and other modifications, additions, and deletions are within the spirit and scope of the invention as defined by the following claims.

What is claimed is:

1. A night vision imaging system (NVIS)-compatible backlight assembly for an LCD display comprising a short-wavelength light source positioned in a first layer and a photoluminescent layer positioned in a second layer for transforming blue monochrome emission from the short wavelength light source into tri-color light for use as a full-color light source, while minimizing radiance in NVIS-sensitive regions.

2. A NVIS-compatible backlight assembly as claimed in claim 1 wherein the short wavelength light source comprises an array of blue LEDs.

3. A NVIS-compatible backlight assembly as claimed in claim 1, wherein the spectral emission in the NVIS regions is substantially minimized.

4. A NVIS-compatible backlight assembly as claimed in claim 1, wherein the spectral profile emitted by the photoluminescent layer is substantially independent of angle of incidence.

5. A NVIS-compatible backlight assembly as claimed in claim 1 wherein the spectral output from the photoluminescent layer is NVIS-compatible without the need for supplemental display filtering.

6. A NVIS-compatible backlight assembly as claimed in claim 1 further comprising supplemental NVIS radiance filtering.

7. A NVIS-compatible backlight assembly as claimed in claim 1 wherein the photoluminescent layer is configured with scattering elements to minimize or avoid the need for a supplemental diffusion layer.

8. A NVIS-compatible backlight assembly as claimed in claim 1 wherein the peak outputs from the photoluminescent layer are tuned to match the LCD's color filters, providing greater efficiency.

9. A NVIS-compatible backlight assembly as claimed in claim 1 wherein the narrow profiles of the emission peaks create more distinct and saturated display colors.

10. A NVIS-compatible backlight assembly as claimed in claim 1 wherein the spectral output from the photoluminescent layer allows for desirable color gamut.

11. A NVIS-compatible backlight assembly as claimed in claim 1 wherein the photoluminescent layer is supplemented with standard NVIS filtering schemes to further improve NVIS performance and pass stricter NVIS requirement levels.

12. A NVIS-compatible backlight assembly as claimed in claim 1 wherein the photoluminescent layer is configured to operate as a filter, lens or other optical component.

13. A NVIS-compatible backlight assembly as claimed in claim 1, wherein the tri-color light output from the photoluminescent layer have Gaussian emission profiles and wherein the long-wavelength emission peak is tuned to enhance NVIS compatibility.

14. A NVIS-compatible backlight assembly as claimed in claim 2 wherein the array of LED elements comprises an array of blue LEDs.

15. A NVIS-compatible backlight assembly as claimed in claim 1 wherein the photoluminescent layer comprises a plurality of quantum dots.

16. A night vision imaging system (NVIS)-compatible backlight assembly for an LCD display comprising a short-wavelength (blue) LED light source positioned in a first layer and a photoluminescent layer positioned adjacent the first layer for transforming blue monochrome emission from the blue light source into tri-color light for use as an full-color light source, while minimizing radiance in NVIS-sensitive regions.

17. A night vision imaging system (NVIS)-compatible backlight assembly comprising a higher or equivalent energy/lower wavelength source positioned in a first layer and a photoluminescent layer positioned adjacent the first to create emissions that achieve full-color and monochrome NVIS compatibility.

18. A NVIS-compatible backlight assembly as claimed in claim 1 wherein the short wavelength light source comprises a single wavelength blue LED.

19. A NVIS-compatible backlight assembly as claimed in claim 1 wherein the short wavelength light source comprises multiple blue LEDs emitting at a single wavelength or multiple wavelengths.

20. A NVIS-compatible backlight assembly as claimed in claim 1 further comprising a light guide configured to channel blue light from the short wavelength light source to a photoluminescent lens included in the photoluminescent layer.

* * * * *